United States Patent [19]

Boudault et al.

[11] 4,435,682
[45] Mar. 6, 1984

[54] FREQUENCY DEMODULATOR EMPLOYING A CIRCUIT HAVING A DELAY VARYING WITH THE RECEIVED FREQUENCY

[75] Inventors: Robert Boudault, Limours; Gérard Pouzoullic, Gif sur Yvette, both of France

[73] Assignee: U.S. Philips Corporation, New York, N.Y.

[21] Appl. No.: 276,600

[22] Filed: Jun. 23, 1981

[30] Foreign Application Priority Data

Jun. 23, 1980 [FR] France .................................. 80 13866

[51] Int. Cl.³ .......................... H03K 9/06; H03D 3/02
[52] U.S. Cl. .................................... 329/107; 329/126; 329/145; 375/94
[58] Field of Search ............... 329/110, 104, 107, 126, 329/145; 375/88, 89, 90, 91, 94

[56] References Cited

U.S. PATENT DOCUMENTS

| | | | |
|---|---|---|---|
| 3,656,064 | 4/1972 | Giles et al. | 329/145 |
| 3,748,586 | 7/1973 | Johnson et al. | 329/104 |
| 4,064,361 | 12/1977 | Kustka et al. | 329/145 |
| 4,368,434 | 1/1983 | Miller et al. | 329/107 |

*Primary Examiner*—Siegfried H. Grimm
*Attorney, Agent, or Firm*—Thomas A. Briody; William J. Streeter; Edward W. Goodman

[57] ABSTRACT

A frequency demodulator including an "exclusive-OR" circuit receiving two square-wave signals having a frequency corresponding to a frequency-modulated signal, and a delay circuit for delaying one of the square-wave signals before application to the "exclusive-OR" circuit, by a delay varying versus frequency in such a way that the absolute value of the phase difference between the square-wave signals varies at most from 0° to 180° inversely with respect to changes in frequency. The output signal of the demodulator is supplied by a low-pass filter connected to the output of the "exclusive-OR" circuit.

5 Claims, 6 Drawing Figures

FREQUENCY DEMODULATOR EMPLOYING A CIRCUIT HAVING A DELAY VARYING WITH THE RECEIVED FREQUENCY

BACKGROUND OF THE INVENTION

The invention relates to a frequency demodulator comprising a first gate circuit having an "exclusive-OR" function and receiving at its two inputs square-wave signals having the frequency of the frequency-modulated signal, delay means for delaying one of said square-wave signals relative to the other, and a low-pass filter connected to the output of the first gate circuit.

A frequency demodulator is, for example, used to recover data transmitted by frequency shift keying a carrier.

A frequency demodulator of the above-defined type is disclosed in, for example, U.S. Pat. No. 3,778,727. In prior art demodulators of this type, a delay circuit is employed to produce a fixed delay of one of the square-wave signals applied to the "exclusive-OR" circuit. This fixed delay is equivalent to a phase shift of the delayed signal proportional to the frequency. A pulse-shaped signal formed by pulses appearing at the transition instants of the non-delayed signal and having a fixed duration is obtained at the output of the "exclusive-OR" circuit. The low-pass filter connected to the output of the "exclusive-OR" circuit supplies the average value of this pulse-shaped signal, which average value is proportional to the phase shift between the delayed and non-delayed signals and consequently proportional to the frequency of the modulated signal. The fixed delay can be realized by means of a shift register in accordance with the technique employed in the above-mentioned U.S. Pat. No. 3,778,727 or by means of any type of analog delay circuits.

Such a demodulator has a response which is basically linear if the delay $\tau$ is independent of the frequency F of the modulated signal, which however is not always easy to realize by means of delay circuits of an analog type. However, in view of the fact that its response is of necessity zero for $F=0$ and at its maximum for $F=\frac{1}{2}\tau$, it has the drawback that it only produces a relatively weak variation of its output signal as the frequency range $\Delta F$ of the modulated signal is relatively narrow and far remote from the frequency $F=0$.

SUMMARY OF THE INVENTION

It is an object of the present invention to avoid this drawback by providing a demodulator, the response of which can easily be adapted to the frequency range of the frequency-modulated signal.

According to the invention, in said demodulator the delay means are arranged so as to produce a delay varying versus frequency in such a way that the absolute value of the phase difference between the square-wave signals varies at most from 0° to 180° inversely with respect to change in frequency.

The means producing a delay varying versus frequency can be realized in a simple manner and at relatively low cost by means of analog circuits. Two analog embodiments of the frequency demodulator in accordance with the invention will be described hereinafter.

DESCRIPTION OF THE DRAWINGS

The invention will now be further described in detail by way of non-limitative example with reference to the accompanying drawings, in which.

DESCRIPTION OF THE PREFERRED EMBODIMENT

Figure 1:
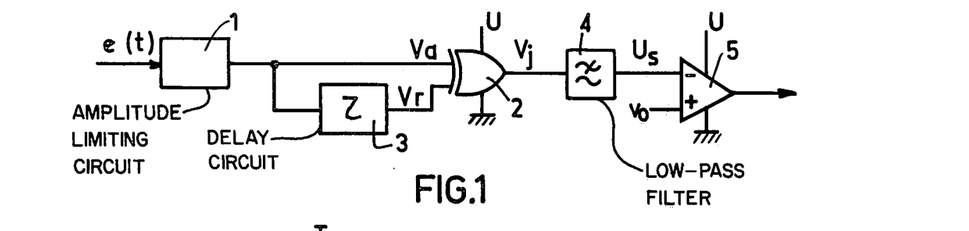
FIG. 1 is a basic circuit diagram of the type of frequency demodulator utilized in the invention.
Figure 2:
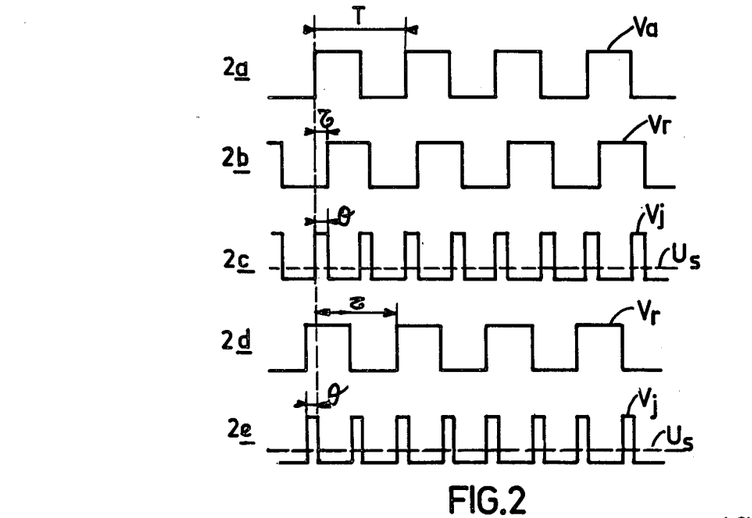
FIG. 2 shows diagrams of the signals appearing in the circuit diagram of FIG. 1.

FIG. 1 shows the basic circuit diagram of a frequency demodulator of the type utilized in the invention. By way of example it is assumed hereinafter that this demodulator is employed to recover data transmitted by means of frequency modulation of a carrier. The frequency modulated signal e(t) is applied to an amplitude limiting circuit 1, which produces a square-wave signal of amplitude U which has the frequency F of the modulated signal e(t). An "exclusive-OR" circuit 2, fed by the voltage U from a supply source, receives at one input the square-wave signal $V_a$ supplied by the limiting circuit 1 and at its other input the signal $V_r$ supplied by a delay circuit 3 which delays the signal $V_a$ by a time $\tau$. The non-delayed signal $V_a$, which has a period $T=1/F$, is shown in diagram 2a of FIG. 2. The signal $V_r$, which is delayed by time $\tau$, is shown in diagram 2b of FIG. 2 for the case where $0<\tau<T/2$. The pulse-shaped signal $V_j$, which is formed by pulses having an amplitude U and follows the transitions of the non-delayed signal $V_a$, is obtained at the output of the "exclusive-OR" circuit 2, as shown in diagram 2c of FIG. 2. These pulses have a width $\theta=\tau$. Diagram 2d of FIG. 2 shows the delayed signal $V_r$ for the case where $T/2<\tau<T$, and diagram 2e shows the pulse-shaped signal which is obtained at the output of the "exclusive-OR" circuit 2; in that case the pulses of the signal $V_j$ precede the transitions of the non-delayed signal $V_a$ and their width is $\theta=T-\tau$. It is obvious that in all cases the duration $\theta$ of the pulses of the signal $V_j$ is at least zero and does not exceed $T/2$. The pulse-shaped signal $V_j$ produced by the "exclusive-OR" circuit 2 is applied to the low-pass filter 4 which supplies the average value thereof. Said average value of the signal $V_j$ is the output signal $U_s$ of the demodulator, which is shown by means of dotted horizontal lines in the diagrams 2c and 2e of FIG. 2. It is easy to demonstrate that the signal $U_s$ has for its expression:

$$U_S = 2U \cdot \theta \cdot F \qquad (1)$$

In the prior art frequency demodulators, the delay circuit 3 produces a delay $\tau$ of a fixed duration and said delay is produced, for example, by a shift register described in the above-mentioned U.S. Pat. No. 3,778,727. From formula (1) it will be seen that the output voltage $U_S$ of the demodulator is proportional to the frequency F of the frequency-modulated signal. In order to recover the data transmitted by assigning two frequencies $F_A$ and $F_B$ to a carrier, the signal $U_S$ is applied to the inverting input of an operational amplifier 5, whose non-inverting input receives the fixed voltage $v_o$. Said amplifier 5 fed by the voltage U operates as a comparator which, by comparing the voltage $U_S$ with the threshold voltage $V_o$, recovers the data corresponding to the frequencies $F_A$ and $F_B$.

In order to judge the performances of said demodulator it is customary to define the variation $\Delta U_S$ of the output signal for a frequency shift from $F_A$ to $F_B$ of the modulated signal. It will be clear that then:

$$\Delta U_S = 2U\theta(F_A - F_B) \qquad (2)$$

It is alternatively possible to define the average value $V_m$ of the output signal $U_S$, it being assumed that the two possible values of said signal $U_S$ for the frequencies $F_A$ and $F_B$ are equally probable. This average value $V_m$ is written:

$$V_m = U\theta(F_A + F_B) \qquad (3)$$

It is of course advantageous when the threshold voltage $V_O$ applied to the comparator 5 would be equal to said average value $V_m$.

By introducing the center frequency $F_o = (F_A + F_B)/2$, the variation $U_S$ of the output signal of the demodulator may be written in relation to its average value $V_m$:

$$\frac{\Delta U_S}{V_m} = \frac{F_A - F_B}{F_o}$$

This last formula reveals a characteristic of this prior art demodulator, namely that the relative value of its output voltage $\Delta U_S/V_m$ only depends on the relative difference $(F_A - F_B)/F_o$ which is a drawback when said relative difference $(F_A - F_B)/F_o$ is rather weak. During data transmission the following frequency values are, for example, employed: $F_A = 1850$ Hz, $F_B = 1650$ Hz. Thus, $\Delta U_S/V_m \approx 11.4\%$. When $V_m = 6$ V, then $\Delta U_S \approx 0.68$ V. In this example the voltage $U_S$ therefore assumes, as a function of the data, in the adjusted operating mode, the two values $U_{SA} = 6.34$ V and $U_{SB} = 5.66$ V which in the comparator 5 must be compared with the voltage $V_o = V_m = 6$ V. It will be obvious that noise and offset affecting the signal $U_S$ or generated in the comparator 5 may cause important bias distortions in the data recovered by said comparator.

The present invention provides a frequency demodulator which can be easily adapted to the frequency range of the modulated signal to obtain variations $\Delta U_S$ of the output signal which are much larger than in the prior art demodulator.

In accordance with the invention, the delay circuit 3 produces a delay $\tau$ varying versus frequency F in such a way that the absolute value of the phase difference between the square-wave signals $V_a$ and $V_r$ applied to the inputs of the "exclusive-OR" circuit 2 varies at most from 0° to 180° inversely with respect to the frequency F.

To show clearly the difference with the prior art demodulator, the output voltage $U_S$ of the demodulator can be expressed as a function of the phase difference $\phi$ between the two signals $V_a$ and $V_r$ applied to the two inputs of the "exclusive-OR" circuit 2, said phase difference $\phi$ always being counted in positive way and limited to 180°. The formula (1) may be written as:

$$U_S = (U/\pi)\phi \text{ where } \phi = 2\pi\theta F \qquad (4)$$

In the prior art frequency demodulator, the delay $\tau$, and consequently the pulse duration $\theta$, are fixed; the phase difference $\phi$ and consequently the output voltage $U_S$ of the demodulator are proportional to the frequency F.

In contrast therewith, in the frequency demodulator according to the invention, the delay $\tau$, and consequently the pulse duration $\theta$, are variable in such a way that the phase difference $\phi$ and consequently the output voltage $U_S$ vary in a sense which is inverse to the frequency F.

The variation $\Delta U_S$ of the demodulator output signal for a frequency shift from $F_A$ to $F_B$ of the modulated signal may be written as:

$$\Delta U_S = 2U|(\theta_A F_A - \theta_B F_B)|, \qquad (5)$$

$\theta_A$ and $\theta_B$ being the pulse durations of the signal $V_j$ for the frequencies $F_A$ and $F_B$.

The average value $V_m$ of the output signal $U_S$ for the frequencies $F_A$ and $F_B$ may be written:

$$V_m = U(\theta_A F_A + \theta_B F_B) \qquad (6)$$

These two formulae (5) and (6) clearly show that for two data frequencies $F_A$ and $F_B$, the variation $\Delta U_S$ and the average value $V_m$ of the output signal $U_s$ may be controlled by acting on the pulse durations $\theta_A$ and $\theta_B$, that is to say, on the values of the delay $\tau$ produced by the delay circuit 3 for the frequencies $F_A$ and $F_B$.

In order to put the invention into effect, it is possible to produce the required variable delay $\tau$ by means of a shift register which is controlled by, for example, shift pulses having a variable frequency as a function of the frequency F. It is simpler to produce said variable delay $\tau$ by analog means, of the type as utilized in two embodiments of the invention which will now be described.

Figure 3:
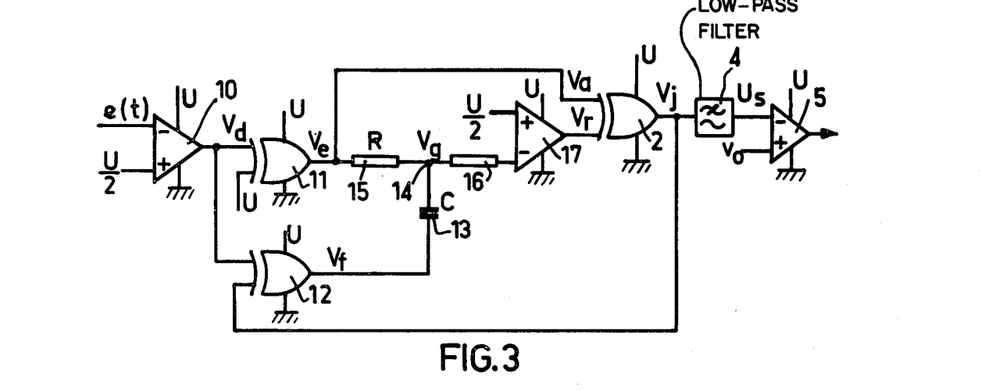
FIG. 3 is a circuit diagram of a first embodiment of the demodulator in accordance with the invention.

A first embodiment of the demodulator in accordance with the invention is shown in FIG. 3. A certain number of elements of the FIGS. 1 and 3 are identical and are given the same reference numerals. All the indicated active circuits are fed from one sole voltage source, not shown, which produces the voltage U. The voltage U/2, which is applied, as will be described hereinafter, to a high-impedance input of the comparison circuits, may advantageously be obtained by means of a voltage divider formed by resistors which are connected to the sole voltage source.

The frequency-modulated signal e(t) is applied to the inverting input of an operational amplifier 10 whose non-inverting input receives a voltage U/2. Said operational amplifier forms an amplitude-limiting circuit producing a square-wave signal $V_d$ having amplitude U and period T, which is shown in diagram 4a of FIG. 4. Said signal $V_d$ is applied to an input of an "exclusive-OR" circuit 11 whose other input receives the voltage U. Said circuit 11 thereby performs the function of an inverting circuit and the signal $V_e$ at its output is shown in diagram 4b. The signal $V_e$ constitutes the non-delayed signal $V_a$ which is applied to an input of the "exclusive-OR" circuit 2. This "exclusive-OR" circuit 2 is followed by low-pass filter 4 and comparator circuit 5, which have the same function as in FIG. 1.

Figure 4:
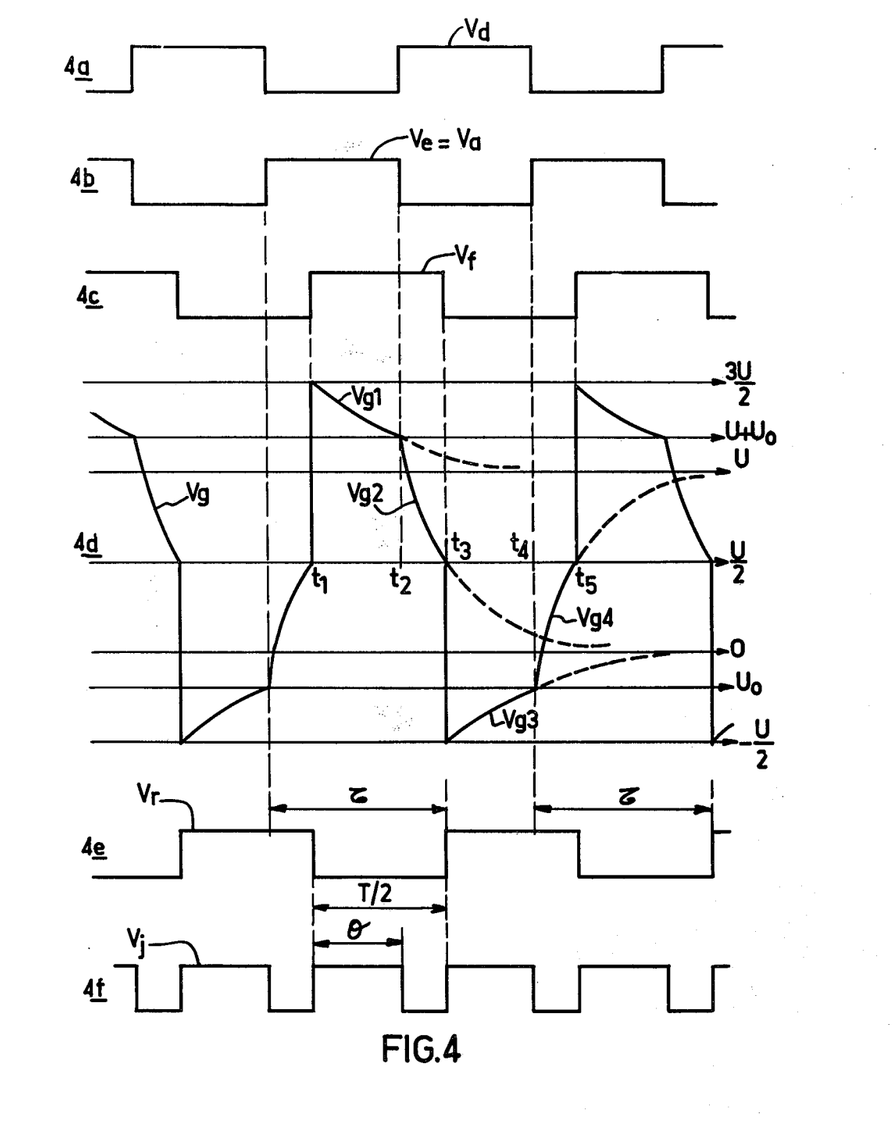
FIG. 4 shows diagrams of the signals appearing in the circuit diagram of FIG. 3.

In order to apply the signal $V_r$ delayed by a variable duration $\tau$ to the other input of the "exclusive-OR"

circuit 2, the following elements are used. An "exclusive-OR" circuit 12 has an input which is connected to the output of the operational amplifier 10, its other input being connected to the output of the "exclusive-OR" circuit 2. The output of the circuit 12 supplies the square-wave signal $V_f$ which has the form shown in the diagram 4c and explained hereinafter. The output of the circuit 12 is connected, via the capacitor 13 having a capacitance C, to a terminal 14 which interconnects series resistors 15 and 16. The signal on said terminal 14 is designated $V_g$ and has the shape shown in diagram 4d and described hereinafter. The series arrangement of the two resistors 15 and 16 is connected between the output of the "exclusive-OR" circuit 11 and the inverting input of an operational amplifier 17. This operational amplifier performs the function of a comparator which compares the variable voltage applied to its inverting input with a voltage U/2 applied to its non-inverting input. It produces, as described hereinafter, the delayed signal $V_r$ which is applied to the other input of the "exclusive-OR" circuit 2. The delayed signal $V_r$ is shown in diagram 4e. It is easy to derive from the two signals $V_a$ and $V_r$ applied to the inputs of the circuit 2 and shown in diagrams 4b and 4e the output signal $V_j$ of this circuit 2, whose average value $U_S$ is obtained by means of filter 4.

With reference to the various diagrams of FIG. 4, it will now be explained how the circuit assembly for obtaining the pulse-shaped signal $V_j$ operates.

The starting point is the instant $t_1$ at which the non-delayed signal $V_a$ has the value U and the increasing signal $V_g$ reaches the voltage U/2 which causes comparator 17 to change state. At this instant $t_1$, the signal $V_r$ drops from U to 0 and the signal $V_j$ increases from 0 to U. As the signal $V_d$ is now equal to 0, the result is that the signal $V_f$ increases from 0 to U. As $V_f$ is applied to one terminal of capacitor 13, the signal $V_g$ at the other terminal of this capacitor increases suddenly from U/2 to 3U/2 at the instant $t_1$. After the instant $t_1$ the signal $V_g$ decreases exponentially with a time constant RC determined by the capacitor 13 having a capacitance C and the resistor 15 having a value R. The law which governs the decrease after the instant $t_1$ is:

$$V_{g1} = \frac{U}{2} e^{-\frac{t-t1}{RC}} + U \quad (7)$$

It is readily verified that for:

$$t = t_1 \; V_{g1} = \frac{3U}{2}$$

$$t = \infty \; V_{g1} = U$$

Diagram 4d shows the curve $V_{g1}$ which is composed of a solid line portion extended by a dashed line.

At the instant $t_2$ at which the signal $V_a$ drops to 0, the signal $V_j$ also drops to zero and, simultaneously, the signal $V_d$ increases to the voltage U, the signal $V_f$ remains at the voltage U. But the fact that the signal $V_e = V_a$ has dropped to 0, causes the voltage $V_g$ to decrease exponentially after instant $t_2$ in accordance with a law other than the law $V_{g1}$ indicated by formula (7): after instant $t_2$ the law governing the decrease of the signal $V_g$ is:

$$V_{g2} = (U + U_o) e^{-\frac{t-t2}{RC}} \quad (8)$$

It is readily verified that for:

$$t = t_2 \; V_{g2} = U + U_o$$

$$t = \infty \; V_{g2} = 0$$

$U_o$ is a certain voltage comprised 0 and U/2. Diagram 4d shows the curve $V_{g2}$ which is composed of a solid line portion extended by a dashed line.

At the instant $t_3$ at which the decreasing signal $V_g$ reaches the voltage U/2 which causes comparator 17 to change state, the signal $V_r$ increases again from 0 to U, which also applies to the signal $V_j$. The result is that the signal $V_f$ drops from U to zero and that the voltage $V_g$ decreases suddenly from +U/2 to −U/2. After this instant $t_3$ the voltage $V_g$ increases exponentially in accordance with the law:

$$V_{g3} = -U/2 \; e^{-\frac{t-t1}{RC}} \quad (9)$$

and it is verified that for:

$$t = t_3 \; V_{g3} = -U/2$$

$$t = \infty \; V_{g3} = 0$$

The curve $V_{g3}$ is shown in diagram 4d; but for the direction in which it varies it has the same form as the curve $V_{g1}$.

At the instant $t_4$ at which the signal $V_a$ increases from 0 to U, the signal $V_j$ drops from U to 0. As the signal $V_d$ also drops from U to 0, the signal $V_f$ remains at zero. As the signal $V_e = V_a$ increases from 0 to U, the signal $V_g$ increases after instant $t_4$ in accordance with a law other than the law governing $V_{g3}$ and which is:

$$V_{g4} = -(U_o + U)e^{-\frac{t-t4}{RC}} + U \quad (10)$$

It is verified that for:

$$t = t_4 \; V_{g4} = -U_o$$

$$t = \infty \; V_{g4} = U$$

The curve $V_{g4}$ is shown in diagram 4d; but for the direction in which it varies it has the same shape as the curve $V_{g2}$.

At the instant $t_5$ at which the signal $V_g$ reaches the voltage U/2, the action occurring at the instant $t_1$ is repeated.

A detailed inspection of the curve of the signal $V_g$ shows that this signal is a periodical signal having the period T and that it is symmetrical with respect to the voltage U/2. This signal $V_g$ makes it possible to generate, at an input of the "exclusive-OR" circuit 2, the delayed signal $V_r$ shown in diagram 4e, which has a time delay $\tau > T/2$ with respect to the signal $V_a$ applied to the other input of this circuit 2. This results in pulses having a duration $\theta$ in the pulse-shaped signal $V_j$ shown in diagram 4f. The above-described circuit produces a delay $\tau$ which varies versus the frequency 1/T, that is to say, seeing that $\theta = T - \tau$, a pulse duration $\theta$ which varies versus the frequency $1/T$.

The law according to which the pulse duration varies versus the frequency $F = 1/T$, is the result of simple calculations, the principle of which is described hereinafter. The diagrams 4d and 4f show that during the period of time $\theta$, the curve $V_{g1}$, for example, changes from $3U/2$ to $U + U_o$. It is easy to deduct from the formula (7) that:

$$\theta = RC \log (U/2U_o) \quad (11)$$

On the other hand, during the interval $T/2 - \theta$ between the pulses of the signal $V_j$, the curve $V_{g2}$ changes, for example, from $U + U_o$ to $U/2$. It is possible to deduce therefrom that:

$$(T/2) - \theta = RC \text{ Log } 2(U + U_o/U)$$

and consequently that:

$$U_o = \frac{U}{e^{\frac{1}{2FRC}} - 1} \quad (12)$$

By combining the formulae (11) and (12) it is finally obtained that:

$$\theta = RC \text{ Log } \tfrac{1}{2} \left[ e^{\frac{1}{2FRC}} - 1 \right] \quad (13)$$

It is easy to see that when the frequency F increases the pulse width $\theta$ decreases and vice versa.

The phase difference $\phi$ between the signals $V_a$ and $V_r$ applied to the "exclusive-OR" circuit 2 has for its expression $\phi = 2\pi\theta F$ and may therefore be written, using the formula (13):

$$\phi = 2\pi F RC \text{ Log } \tfrac{1}{2} \left[ e^{\frac{1}{2FRC}} - 1 \right] \quad (14)$$

It is possible to verify that this expression, in accordance with formula (14), satisfies a characteristic of the invention, namely that $\phi$ decreases when the frequency increases and vice versa. In addition, it is possible to verify that the derivative of $\phi$ increases when the frequency increases.

In accordance with formula (14), the output voltage $U_S$ of the demodulator may be written:

$$U_S = 2U F RC \text{ Log } \tfrac{1}{2} \left[ e^{\frac{1}{2FRC}} - 1 \right] \quad (15)$$

This output voltage varies versus the frequency F in the same way as the phase difference $\phi$. It decreases when the frequency F increases and the slope of the curve of $U_S$ as a function of F increases when the frequency increases. The formula (15) shows clearly that it is possible to adjust the law which governs the variation of the output voltage $U_S$ versus the frequency F by adjusting the time constant RC, that is to say, in practice, the ohmic value R of the resistor 15.

For the case of a demodulator for data transmitted by two frequencies $F_A$ and $F_B$, it may be of interest that for the highest frequency, for example for $F_A$, the output signal $U_S$ be zero. This condition is realized when for said frequency $F_A$, the width $\theta_A$ of the pulses of the signal $V_j$ is zero. It can therefore be easily deduced from the formulae (11) and (12) that then:

$$RC = \tfrac{1}{2} \frac{1}{F_A \text{Log} 3} \quad (16)$$

This formula (16) also shows the value to be given to the time constant RC in order to obtain a zero voltage $U_{SA}$ for the highest frequency $F_A$. The variation $\Delta U_S$ of the output signal of the demodulator has therefore, in accordance with the formula (5), the value $\Delta U_S = 2U \theta_B F_B$, where $\theta_B$ is given by formula (13) by replacing RC therein by the value given by formula (16). For this case, the variation $\Delta U_S$ has its maximum possible value and the average value $V_m$ between the two values of the output signal $U_S$ for the frequencies $F_A$ and $F_B$ is of necessity equal to $\Delta U_S/2$, as for one of these frequencies, $F_A$, the output signal is zero.

Figure 5:
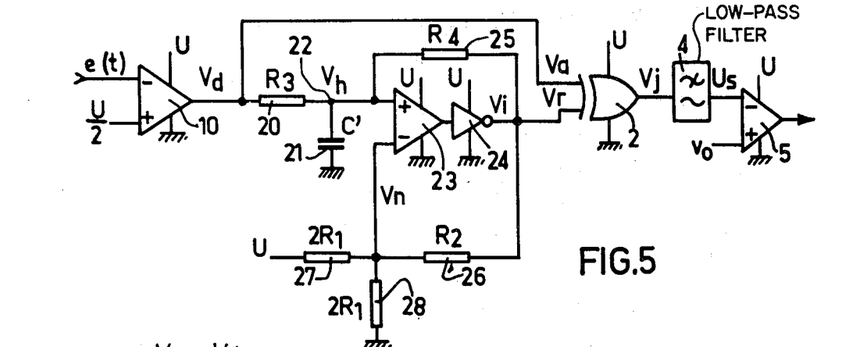
FIG. 5 is a circuit diagram of a second embodiment of a demodulator in accordance with the invention.

The circuit diagram of FIG. 5 shows a second embodiment of the demodulator in accordance with the invention. This FIG. 5 comprises a number of elements which are the same as shown in FIGS. 1 and 3 and are given the same reference numerals.

The square-wave signal $V_d$, having amplitude U and having the frequency $F = 1/T$ of the frequency-modulated signal $e(t)$, appears at the output of the amplitude-limiting circuit formed by the operational amplifier 10. This signal $V_d$, which is represented in diagram 6a of FIG. 6, constitutes the non-delayed signal $V_a$ which is applied to an input of the "exclusive-OR" circuit 2.

The signal $V_r$ applied to the other input of the circuit 2 is obtained by delaying the signal $V_d$ by a time $\tau$ which varies versus the frequency F, by means of the following circuits. The signals $V_d$ is applied to an integrating circuit formed by a resistor 20 having the value $R_3$ and being arranged in series with a capacitor 21 having the capacitance $C'$, which is connected to the ground terminal connected to the negative terminal of the voltage supply source. At the junction 22 of resistor 20 and capacitor 21, a signal $V_h$ is obtained, whose shape is shown in diagram 6b of FIG. 6 and will be explained hereinafter. The terminal 22 is connected to the non-inverting input of an operational amplifier 23 which functions as a comparator comparing the signal $V_h$ applied to its non-inverting input with the signal $V_n$ applied to its inverting input. The output signal of comparator circuit 23 is inverted by means of an inverter circuit 24. The output signal $V_i$ of this inverter circuit 24 is applied to the non-inverting input of operational amplifier 23 via a resistor 25 having value $R_4$ and also to the inverting input of amplifier 23 via a resistor 26 having the value $R_2$. Said inverting input is also connected to the junction of two series-arranged resistors 27 and 28, which have the same value $2R_1$ and are connected between the positive terminal of the voltage supply source having the value U and ground. The signal $V_n$ at the inverting input of operational amplifier 23 may assume two values, depending on whether the signal $V_i$ has the value 0 or U. It is easy to demonstrate that these two values are $$\left. \begin{array}{ll} \text{For } V_i = 0 & V_n = u_2 \\ \text{For } V_i = U & V_n = U - u_2 \end{array} \right\} \quad (17)$$

-continued where $$u_2 = \frac{U}{2} \cdot \frac{R_2}{R_2 + R_1}$$

Figure 6:
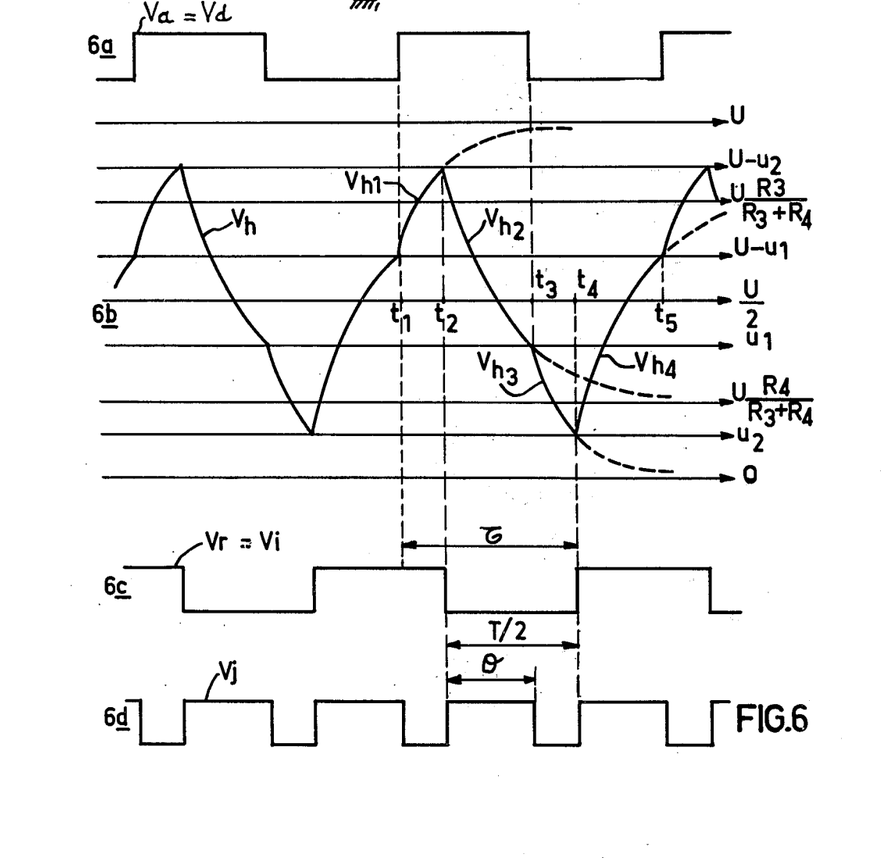
FIG. 6 shows diagrams of signals appearing in the circuit diagram of FIG. 5.

Operational amplifier 23 compares the signal $V_h$ to said two possible values of the signal $V_n$, the result being the signal $V_i$ at the output of inverter circuit 24. Said signal $V_i$, represented in diagram 6c, forms the delayed signal $V_r$ applied to an input of "exclusive-OR" circuit 2. It is easy to deduce from the signal $V_a$ and $V_r$ represented by the diagrams 6a and 6c, the signal $V_j$ which appears at the output of "exclusive-OR" circuit 2 and which, as in the foregoing, is formed by pulses having an amplitude U and a duration $\theta$ as shown by diagram 6d.

It will now be described how the signal $V_h$ present at the non-inverting input of operational amplifier 23 and represented by diagram 6b is formed.

The starting point is the instant $t_1$ at which the signal $V_d$ increases from 0 to U, the signal $V_i$ then having the value U which, in accordance with the relations (17), means that $V_n = U - u_2$. At said instant $t_1$, the signal $V_h$ has a certain value $U - u_1 < U - u_2$, $u_1$ being a value which will be defined hereinafter. After the instant $t_1$, since the voltages $V_i$ and $V_d$ have the same value U, one may say that capacitor 21 is charged by means of the voltage U applied to it via the parallel-arranged resistors 20 and 25. If the equivalent resistance of said two parallel arranged resistors 20 and 25 is denoted as $R'$, in which $R' = (R_3 R_4 / R_3 + R_4)$, it is easy to demonstrate that the law, in accordance with which the voltage $V_h$ varies after the instant $t_1$, is:

$$V_{h1} = u_1 \left(1 - e^{-\frac{t-t_1}{R'C}}\right) + U - u_1 \quad (18)$$

It is possible to verify that for:

$t = t_1 \quad V_{h1} = U - u_1$ $t = \infty \quad V_{h1} = U$

Diagram 6b shows the curve $V_{h1}$ which is composed of a solid line portion extended by means of a dashed line.

At the instant $t_2$ at which the increasing voltage $V_h$ reaches the voltage $V_n = U - u_2$ present at the inverting input of operational amplifier 23, the voltage $V_i = V_r$ drops to zero as shown by diagram 6c. As this results from the relations (17), the voltage $V_n$ drops simultaneously to $U_2$. After the instant $t_2$, capacitor 21 discharges via the center tap of a voltage divider formed by the series arrangement of the resistors 25 and 20, one end of said voltage divider being connected to the voltage U (resistor 20), the other end being connected to ground (resistor 25). It can be shown that the law in accordance with which the voltage $V_h$ varies after the instant $t_2$ is:

$$V_{h2} = \left(U - u_2 - \frac{R_4}{R_3 + R_4} u\right) e^{-\frac{t-t_2}{R'C}} + \frac{R_4}{R_3 + R_4} U \quad (19)$$

It can be verified that then for:

$t = t_2 \quad V_{h2} = U - u_2$ $t = \infty \quad V_{h2} = \frac{R_4}{R_3 + R_4} U$ Diagram 6b shows the curve $V_{h2}$ which is formed by a solid line portion extended by a dashed line.

At the instant $t_3$ at which the signal $V_d$ drops from U to 0, the signal $V_h$ has a certain value $u_1$. After the instant $t_3$, since the signals $V_i$ and $V_d$ have the same value 0, capacitor 21 is discharged by means of the voltage 0 which is applied to it via the two resistors 20 and 25 arranged in parallel. It can be shown that the law in accordance with which the voltage $V_h$ varies after the instant $t_3$ is:

$$V_{h3} = u_1 e^{-\frac{t-t_3}{R'C}} \quad (20)$$

It can be verified that then for:

$t = t_3 \quad V_{h3} = u_1$ $t = \infty \quad V_{h3} = 0$.

Diagram 6b shows the curve $V_{h3}$ which is formed by a solid line portion extended by a dashed line.

At the instant $t_4$ at which the decreasing signal $V_h$ reaches the voltage $V_n = u_2$ present at the inverting input of operational amplifier 23, the voltage $V_i = V_r$ increases from 0 to U, as shown by diagram 6c. As this results from the relations (17), the voltage $V_n$ simultaneously increases to $U - u_2$. After the instant $t_4$, capacitor 21 is charged by the center tap of a voltage divider formed by the series arrangement of the resistors 25 and 20, one end of said voltage divider being connected to the voltage U (resistor 25) the other end being connected to ground (resistor 20). It can be shown that the law in accordance with which the voltage $V_h$ varies after the instant $t_4$ is:

$$V_{h4} = \left(u_2 - \frac{R_3}{R_3 + R_4} U\right) e^{-\frac{t-t_4}{R'C}} + \frac{R_3}{R_3 + R_4} U \quad (21)$$

It can be verified that then for:

$t = t_4 \quad V_{h4} = u_2$ $t = \infty \quad V_{h4} = \frac{R_3}{R_3 + R_4} U$ Diagram 6b shows the curve $V_{h4}$ which is formed by a solid line portion extended by a dashed line.

At the instant $t_5$ at which the signal $V_d$ increases from 0 to U, the signal $V_h$ reaches a voltage $U - u_1$, $u_1$ being the voltage of the signal $V_h$ at the instant $t_3$. After the instant $t_5$ there follows the same procedure as after the instant $t_1$.

An examination of the curve of the signal $V_h$ shows that this signal is periodical with the period T and symmetrical with respect to the voltage U/2. By means of this signal $V_h$ it is possible to obtain, at an input of "exclusive-OR" circuit 2 the signal $V_r$ shown in diagram 6c, which signal is delayed by $\tau > T/2$, with respect to the signal $V_a$ applied to the other input of said circuit 2.

This results in pulses having an amplitude U and a duration $\theta$ in the pulse-shaped signal $V_j$ produced by "exclusive-OR" circuit 2 and shown in diagram 6d. This delay $\tau$ varies versus the frequency $F=1/T$, the result being that the duration of the pulses $\theta=T-\tau$ of the signal $V_j$ also varies versus the frequency F.

To determine the law in accordance with which $\theta$ varies versus the frequency F, it can be noted that during the interval $T/2-\theta$ between the pulses of the signal $V_j$, the curve $V_{h1}$, for example, varies from $U-u_1$ to $U-u_2$ and that during the interval $\theta$, the curve $V_{h2}$, for example, varies from $U-u_2$ to $u_1$. Applying the formulae (18) and (19), it is possible to show that $\theta$ has for its expression:

$$\theta = \frac{1}{2F} - R'C' \, \text{Log} \frac{KU}{u_2 - (U - u_2 - KU)e^{-\frac{1}{2FR'C'}}} \quad (22)$$

where:

$$K = \frac{R_4}{R_3 + R_4}$$

With this expression of $\theta$, it is possible to verify that the phase difference $\phi = 2\pi\theta F$, between the two signals $V_a$ and $V_f$ applied to the inputs of "exclusive-OR" circuit 2, decreases when the frequency increases and vice versa.

The output voltage $U_S$ of the demodulator, which has for its expression $U_S = 2UF\theta = (u/\pi)\phi$, varies versus the frequency F in the same way as the phase difference $\phi$. It is clear that the law in accordance with which $\theta$ varies and consequently the law in accordance with which the output voltage $U_S$ varies versus frequency, can be adjusted at one's option, by acting on the different parameters appearing in the formula (22), such as $C'$, $R'$, K and $u_2$; the parameters $R'$ and K depend on the values $R_3$ and $R_4$ of the resistors 20 and 25; the voltage $u_2$ depends in particular on the value $R_2$ of the resistor 26 and the value $2R_1$ of the resistors 27 and 28. It is therefore possible to obtain the values as desired for the variation $\Delta U_S$ of the demodulator output signal for two frequencies $F_A$ and $F_B$ and for the average value $V_m$ of said signal.

A special adjustment which may be advantageous for certain applications such as a discrimination between two frequencies $F_A$ and $F_B$ is effected by assigning such values to the different elements of the demodulator that for the highest frequency $F_A$ the output voltage $U_S$ is substantially zero and that for the lowest frequency $F_B$ the output voltage is substantially equal to the supply voltage U. This means that the pulse duration $\theta_A$ for the frequency $F_A$ must be zero and that the pulse duration $\theta_B$ for the frequency $F_B$ must be equal to $\frac{1}{2}F_B$. The most advantageous conditions for discrimination between the two frequencies $F_A$ and $F_B$ are then obtained, as the variation $\Delta U_S$ of the output signal for these two frequencies $F_A$ and $F_B$ is substantially equal to the supply voltage U, while the average value $M_m$ between the two values of the output signal is, in accordance with formula (6), equal to U/2.

For this special adjustment there now follow the ratios required between the values of the different elements of the demodulator. By applying the formula (22) the respective conditions $\theta_A = 0$ and $\theta_B = \frac{1}{2}F_B$ may be written:

$$R'C' \, \text{Log} \frac{KU}{u_2 - (U - u_2 - KU)e^{-\frac{1}{2F_A R'C'}}} = \frac{1}{2F_A} \quad (23)$$

$$R'C' \, \text{Log} \frac{KU}{u_2 - (U - u_2 - KU)e^{-\frac{1}{2F_B R'C'}}} = 0 \quad (24)$$

The relation (24) may then also be written as:

$$KU = u_2 - (U - u_2 - KU)e^{-\frac{1}{2F_B R'C'}} \quad (25)$$

For $u_2 = KU$, the relation (25) is virtually satisfied if $F_B$ is sufficiently small with regard to $\frac{1}{2}R'C'$. It is then virtually obtained that $\theta_B = \frac{1}{2}F_B$ and $U_S = 0$ if $u_2 = KU$ or, taking account of the values for $u_2$ and K given in the foregoing, if:

$$\frac{1}{2}\frac{R_2}{R_1 + R_2} = \frac{R_4}{R_3 + R_4} \quad (26)$$

When it is assumed that $u_2 = KU$, that is to say if the relation (26) is satisfied, it can be shown that the formula (23), which is conditioned to obtain that $\theta = 0$ and $U_S = U$, may be written:

$$R_3 \, e^{-\frac{1}{2F_A C R_3}} = R_4 \, e^{-\frac{1}{2F_A C R_4}} \quad (27)$$

Finally, the quantity $\frac{1}{2}R'C'$ being chosen large with respect to the lowest frequency $F_B$, the two formulae (26) and (27) provide the means to determine the values of the different elements of the demodulator to obtain that virtually $\Delta U_S = U$ and $V_m = U/2$.

In the analog embodiments of the frequency demodulator as they have been described in the foregoing, it is advantageous that all the circuits employed are on the one hand supplied from a sole voltage source and on the other hand realized in CMOS technology, particularly because of the fact that the output resistance of the circuits produced in said CMOS technology is low. These two measures are very advantageous for the stability of the characteristics of the demodulator as a function of the ambient temperature fluctuations and the supply source fluctuations.

What is claimed is:

1. A frequency demodulator comprising a first gate circuit having an "exclusive-OR" function and receiving at its two inputs square-wave signals each having a frequency corresponding to a frequency modulated signal, delay means for delaying one of said square-wave signals relative to the other before application to said first gate circuit, and a low-pass filter connected to the output of the first gate circuit, said delay means producing a delay varying with frequency in an inversely proportional sense such that the phase difference between said square-wave signals varies at most from 0° to 180°, characterized in that said delay means comprises an integrating circuit receiving the non-delayed signal and producing an output signal, and a comparator for comparing said output signal of the integrating circuit with a threshold signal and producing a comparator output signal, the delayed signal being derived from said comparator output signal.

2. A frequency demodulator as claimed in claim 1, characterized in that said output signal of the integrating circuit is obtained at one terminal of a capacitor of said integrating circuit, the other terminal of said capacitor receiving a signal derived from the non-delayed signal and the output signal of said first gate circuit having an "exclusive-OR" function, said threshold signal being a one-level signal and the delayed signal being constituted by said comparator output signal.

3. A frequency demodulator as claimed in claim 2, characterized in that said signal applied to said other terminal of said capacitor is formed at the output of a second "exclusive-OR" gate circuit, said second "exclusive-OR" gate circuit receiving at one input the output signal of said first gate circuit and at its other input a complementary signal of the non-delayed signal.

4. A frequency demodulator as claimed in claim 1, characterized in that said output signal of the integrating circuit is obtained at one terminal of a capacitor of said integrating circuit, said one terminal receiving the delayed signal through a first resistor and the non-delayed signal through a second resistor constituting the resistor of said integrating circuit, the other terminal of said capacitor being at fixed potential, said threshold signal being a two-level signal obtained by means of a voltage divider receiving the delayed signal, and the delayed signal being constituted by the inverted comparator output signal.

5. A frequency demodulator as claimed in claim 4, characterized in that the components of the circuits serving to form the delayed signal are adjusted in such a way that the phase difference between the said delayed and non-delayed square-wave signals is substantially zero for the highest frequency and substantially equal to 180° for the lowest frequency.

* * * * *